(12) United States Patent
Zamir et al.

(10) Patent No.: US 11,455,208 B2
(45) Date of Patent: Sep. 27, 2022

(54) SOFT INFORMATION FOR PUNCTURED BIT ESTIMATION IN A DATA STORAGE DEVICE

(71) Applicant: Western Digital Technologies, Inc., San Jose, CA (US)

(72) Inventors: Ran Zamir, Ramat Gan (IL); Omer Fainzilber, Herzliya (IL); David Avraham, Even Yehuda (IL); Eran Sharon, Rishon Lezion (IL)

(73) Assignee: Western Digital Technologies, Inc., San Jose, CA (US)

( * ) Notice: Subject to any disclaimer, the term of this patent is extended or adjusted under 35 U.S.C. 154(b) by 53 days.

(21) Appl. No.: 17/171,746

(22) Filed: Feb. 9, 2021

(65) Prior Publication Data

US 2022/0058083 A1    Feb. 24, 2022

Related U.S. Application Data

(60) Provisional application No. 63/067,931, filed on Aug. 20, 2020.

(51) Int. Cl.
  *G11C 29/00* (2006.01)
  *G06F 11/10* (2006.01)
  *H03M 13/45* (2006.01)

(52) U.S. Cl.
  CPC ......... *G06F 11/1068* (2013.01); *H03M 13/45* (2013.01)

(58) Field of Classification Search
  CPC ............ G06F 11/1008; G06F 11/1012; G06F 11/1068; H03M 13/45; H03M 13/1111; H03M 13/1142; H03M 13/6262
  See application file for complete search history.

(56) References Cited

U.S. PATENT DOCUMENTS

| 8,271,846 B2 | 9/2012 | Myung et al. |
| 8,504,887 B1 | 8/2013 | Varnica et al. |
| 8,516,352 B2 | 8/2013 | Sharon et al. |

(Continued)

OTHER PUBLICATIONS

Kwon et al., "Fast Decoding of Rate-Compatible Punctured LDPC Codes," 2007 IEEE International Symposium on Information Theory, 2007, pp. 216-220.

*Primary Examiner* — Guy J Lamarre
*Assistant Examiner* — Enamul M Kabir
(74) *Attorney, Agent, or Firm* — Michael Best & Friedrich LLP

(57) ABSTRACT

A memory controller including, in one implementation, a memory interface and a control circuit. The memory interface is configured to receive a punctured codeword read from a non-volatile memory. The control circuit is configured to determine error probability values for a plurality of check nodes associated with a punctured bit included in the punctured codeword. The control circuit is also configured to determine an error probability value for the punctured bit based on the error probability values for the plurality of check nodes associated with the punctured bit and a variable degree associated with the punctured bit. The control circuit is further configured to determine a log likelihood ratio (LLR) value for the punctured bit based on the error probability value for the punctured bit. The control circuit is also configured to decode the punctured codeword using the LLR value for the punctured bit.

20 Claims, 4 Drawing Sheets

(56) References Cited

U.S. PATENT DOCUMENTS

| | | |
|---|---|---|
| 10,177,787 B1* | 1/2019 | Danjean .............. H03M 13/618 |
| 2002/0186778 A1* | 12/2002 | Agami ................ H04L 27/3461 |
| | | 375/261 |
| 2005/0152408 A1* | 7/2005 | Jeong .................. H03M 13/356 |
| | | 370/529 |
| 2010/0058140 A1* | 3/2010 | Matsumoto ....... H03M 13/6508 |
| | | 714/752 |
| 2014/0153628 A1* | 6/2014 | Vojcic ................... H04L 1/0057 |
| | | 375/227 |
| 2014/0164865 A1* | 6/2014 | Sharon .............. H03M 13/1105 |
| | | 714/752 |
| 2014/0229788 A1 | 8/2014 | Richardson |
| 2015/0256196 A1* | 9/2015 | Alhussien ............. H03M 13/13 |
| | | 714/807 |
| 2015/0288386 A1* | 10/2015 | Murakami ......... H03M 13/1111 |
| | | 714/752 |
| 2017/0255512 A1* | 9/2017 | Zamir ................. H03M 13/618 |
| 2018/0159560 A1* | 6/2018 | Sharon .................... G06F 3/067 |
| 2019/0116002 A1* | 4/2019 | Xu ........................ H04L 1/0041 |
| 2020/0021315 A1* | 1/2020 | Chen ................ H03M 13/6368 |
| 2020/0099395 A1 | 3/2020 | Sharon et al. |
| 2020/0304149 A1 | 9/2020 | Zamir et al. |
| 2020/0321986 A1* | 10/2020 | Hui ....................... H03M 13/13 |
| 2021/0058100 A1* | 2/2021 | Hong ................... H03M 13/13 |
| 2021/0281277 A1* | 9/2021 | Yamamoto ........... H04L 1/0041 |

* cited by examiner

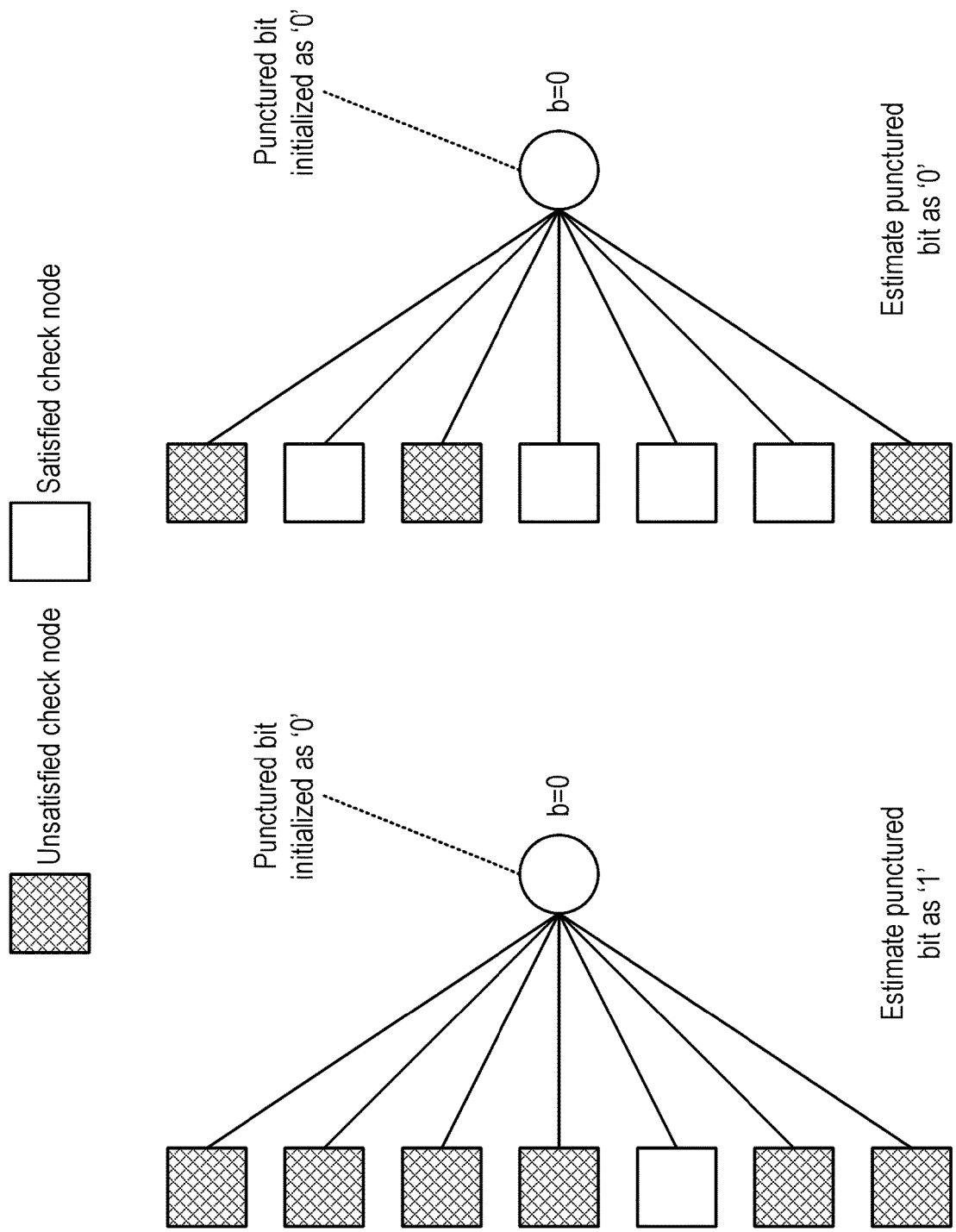

SOFT INFORMATION FOR PUNCTURED BIT ESTIMATION IN A DATA STORAGE DEVICE

CROSS-REFERENCE TO RELATED APPLICATION

This application claims priority to and the benefit of U.S. Provisional Patent Application No. 63/067,931, filed on Aug. 20, 2020, the entire contents of which is incorporated herein by reference.

BACKGROUND

This application relates generally to memory devices, and more particularly, to a controller that uses soft information for estimating punctured bits in codewords.

Puncturing is a technique for adjusting the code rate and code length of error correcting codes and improving code performance. A code matrix can be configured to be longer than needed and some of the codeword bits are discarded and not saved in memory. These discarded bits are referred to as "punctured." When decoding a punctured codeword, the values of punctured bits must be restored. Many ECC (error correcting code) decoding solutions require a "hard" value for each bit in a codeword. For example, bit-flipping decoders (which are included in many ECC decoding solutions for storage applications because of area and power advantages) require each bit in a codeword to be set to a value of either '1' or '0.' Arbitrarily setting initial values for punctured bits adds a large number of errors, which degrade decoding performance.

SUMMARY

Values of punctured bits in a punctured codeword can be estimated using hard estimations. ECC decoding performance can be improved by adding soft information. The present disclosure provides devices, methods, and apparatuses that, among other things, determine soft information for punctured bits in punctured codewords.

The present disclosure provides a memory controller including, in one implementation, a memory interface and a control circuit. The memory interface is configured to receive a punctured codeword read from a non-volatile memory. The control circuit is coupled to the memory interface. The control circuit is configured to determine error probability values for a plurality of check nodes associated with a punctured bit included in the punctured codeword. The control circuit is also configured to determine an error probability value for the punctured bit based on the error probability values for the plurality of check nodes associated with the punctured bit and a variable degree associated with the punctured bit. The control circuit is further configured to determine a log likelihood ratio (LLR) value for the punctured bit based on the error probability value for the punctured bit. The control circuit is also configured to decode the punctured codeword using the LLR value for the punctured bit.

The present disclosure also provides a method performed by a control circuit coupled to a non-volatile memory. The method includes receiving a punctured codeword read from the non-volatile memory. The method also includes determining error probability values for a plurality of check nodes associated with a punctured bit included in the punctured codeword. The method further includes determining an error probability value for the punctured bit based on the error probability values for the plurality of check nodes associated with the punctured bit and a variable degree associated with the punctured bit. The method also includes determining an LLR value for the punctured bit based on the error probability value for the punctured bit. The method further includes decoding the punctured codeword using the LLR value for the punctured bit.

The present disclosure further provides an apparatus including means for receiving a punctured codeword read from a non-volatile memory. The apparatus also includes means for determining error probability values for a plurality of check nodes associated with a punctured bit included in the punctured bit. The apparatus further includes means for determining an error probability value for the punctured bit based on the error probability values for the plurality of check nodes associated with the punctured bit and a variable degree associated with the punctured bit. The apparatus also includes means for determining an LLR value for the punctured bit based on the error probability value for the punctured bit. The apparatus further includes means for decoding the punctured codeword using the LLR value for the punctured bit.

Various aspects of the present disclosure provide for improvements in memory devices. The present disclosure can be embodied in various forms, including hardware or circuits controlled by software and/or firmware. The foregoing summary is intended solely to give a general idea of various aspects of the present disclosure and does not limit the scope of the present disclosure in any way.

BRIEF DESCRIPTION OF THE DRAWINGS

FIG. 2 is a first example of a bipartite graph for a punctured bit.

FIG. 3 is a second example of a bipartite graph for a punctured bit.

DETAILED DESCRIPTION

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the control circuit and the ECC engine may be performed by hardware (for example, analog or digital circuits), a combination of hardware and software (for example, program code or firmware stored in a non-transitory computer-readable medium that is executed by a processor or control circuitry), or any other suitable means. The following description is intended solely to give a general idea of various aspects of the present disclosure and does not limit the scope of the disclosure in any way. Furthermore, it will be apparent to those of skill in the art that, although the present disclosure refers to NAND flash, the concepts discussed herein are applicable to other types of solid-state memory, such as NOR, PCM (Phase Change Memory), ReRAM, etc.

Figure 1:
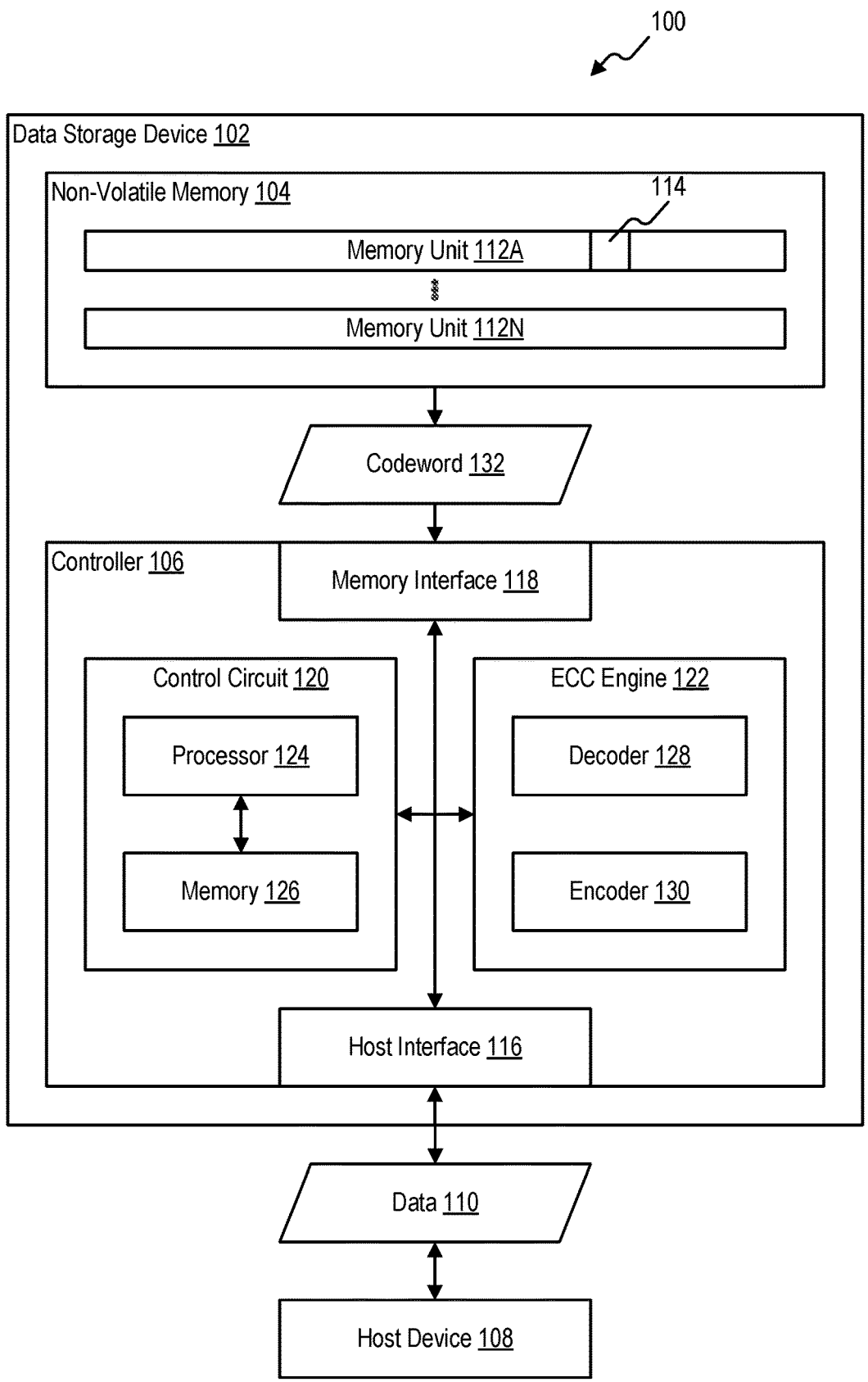
FIG. 1 is block diagram of one example of a system including a data storage device, in accordance with some implementations of the present disclosure.

FIG. 1 is block diagram of one example of a system 100 that includes a data storage device 102. In some implementations, the data storage device 102 is a flash memory device. For example, the data storage device 102 is a Secure Digital SD® card, a microSD® card, or another similar type of data storage device. The data storage device 102 illustrated in FIG. 1 includes a non-volatile memory 104 and a controller 106. The data storage device 102 is coupled to a host device 108. The host device 108 is configured to provide data 110 (for example, user data) to the data storage device 102 to be stored, for example, in the non-volatile memory 104. The host device 108 is also configured to request data 110 to be read from the non-volatile memory 104. The host device 108 is, for example, a smart phone, a music player, a video player, a gaming console, an e-book reader, a personal digital assistance, a tablet, a notebook computer, or another similar device.

The non-volatile memory 104 of the data storage device 102 is coupled to the controller 106. In some implementations, the non-volatile memory 104 is NAND flash memory. The non-volatile memory 104 illustrated in FIG. 1 includes a plurality of memory units 112A-112N (for example, flash memory units). Each of the plurality of memory units 112A-112N includes a plurality of storage elements. For example, in FIG. 1, the memory unit 112A includes a representative storage element 114. In some implementations, the storage element 114 is a multi-level cell ("MLC") flash memory cell, such as a four bits per cell ("4BPC") flash memory cell. In other implementations, the storage element 114 is a single level cell ("SLC") flash memory cell, a two bits per cell ("2BPC") flash memory cell, a three bits per cell ("3BPC") flash memory cell, or a flash memory cell having a larger number of bits per cell (for example, between five and ten bits per cell). In some implementations, the plurality of memory units 112A-112N are included in a word line or page of an MLC flash memory. In other implementations, the plurality of memory units 112A-112N are spread across multiple word lines or pages of an MLC flash memory.

The controller 106 illustrated in FIG. 1 includes a host interface 116, a memory interface 118, a control circuit 120, and an ECC engine 122. The controller 106 is illustrated in FIG. 1 in a simplified form. One skilled in the art would recognize that a controller for a non-volatile memory would include additional modules or components other than those specifically illustrated in FIG. 1. Additionally, although the data storage device 102 is illustrated in FIG. 1 as including the controller 106 and modules for performing, for example, ECC, in other implementations, the controller 106 is instead located within the host device 108 or is otherwise separate from the data storage device 102. As a result, ECC and other flash translation layer ("FTL") operations that would normally be performed by the controller 106 (for example, wear leveling, bad block management, data scrambling, garbage collection, address mapping, etc.) can be performed by the host device 108 or another device that connects to the data storage device 102.

The controller 106 is configured to send data to, and receive data and instructions from, the host device 108 via the host interface 116. The host interface 116 enables the host device 108 to, for example, read from the non-volatile memory 104 and to write to the non-volatile memory 104 using any suitable communication protocol. Suitable communication protocols include, for example, the Universal Flash Storage ("UFS") Host Controller Interface specification, the Secure Digital ("SD") Host Controller specification, etc.

The controller 106 is also configured to send data and commands to, and receive data from, the non-volatile memory 104 via the memory interface 118. As an illustrative example, the controller 106 is configured to send data and a write command to instruct the non-volatile memory 104 to store data in a particular memory location in the non-volatile memory 104. The controller 106 is also configured to send a read command to the non-volatile memory 104 to read data from a particular memory location in the non-volatile memory 104.

The control circuit 120 illustrated in FIG. 1 includes an processor 124 (for example, a microprocessor, a microcontroller, a field-programmable gate array ["FPGA"] semiconductor, an application specific integrated circuit ["ASIC"], or another suitable programmable device) and a non-transitory computer readable medium or memory 126 (for example, including random access memory ["RAM"] and read only memory ["ROM"]). The processor 124 is operatively connected to the various modules within the control circuit 120, the controller 106, and the data storage device 102. For example, firmware is loaded in a ROM of the memory 126 as computer executable instructions. Those computer executable instructions are capable of being retrieved from the memory 126 and executed by the processor 124 to control the operation of the control circuit 120 and perform the processes described herein (for example, punctured bit estimation and ECC). In some implementations, one or more modules of the control circuit 120 correspond to separate hardware components within the control circuit 120. In other implementations, one or more modules of the control circuit 120 correspond to software stored within the memory 126 and executed by the processor 124. The memory 126 is configured to store data used by the control circuit 120 during operation.

The ECC engine 122 is configured to receive data to be stored in the non-volatile memory 104. The ECC engine 122 is configured to encode data using an ECC encoding scheme. In some implementations, the ECC encoding scheme is a Reed Solomon encoding scheme, a Bose-Chaudhuri-Hocquenghem ("BCH") encoding scheme, a low-density parity check ("LDPC") encoding scheme, or another suitable encoding scheme. The ECC engine 122 illustrated in FIG. 1 includes a decoder 128 and an encoder 130. The decoder 128 is configured to decode data that is read from the non-volatile memory 104. For example, the decoder 128 is configured to decode a codeword 132 read from the non-volatile memory 104. The decoder 128 is configured to detect and correct bit errors that are present in the data read from the non-volatile memory 104. The decoder 128 corrects bit errors present in the data read from the non-volatile memory 104 up to an error correction capability of the implemented ECC scheme. In some implementations, the ECC engine 122 is included in the control circuit 120.

As described above, when decoding a punctured codeword, punctured bits must be set to initial values. Arbitrarily setting initial values of punctured bits adds a large number of errors which degrades decoding performance. The value of a punctured bit can be estimated using a hard estimation. For example, a punctured bit in a punctured codeword is initialized as a '0' and a syndrome vector for the punctured codeword is generated. The number of unsatisfied check nodes associated with punctured bit is determined using the syndrome vector. Then, the estimated value of the punctured bit is determined according to a majority vote. As a first example, FIG. 2 is a bipartite graph for a punctured bit. In FIG. 2, the value of the punctured bit is initialized as '0' and six of the seven check nodes are unsatisfied. Given that the majority of check nodes in FIG. 2 are unsatisfied, the estimated value of punctured bit is '1.' As a second example, FIG. 3 is a bipartite graph for another punctured bit. In FIG. 3, the punctured bit is initialized as '0' and only three of the seven check nodes are unsatisfied. Given that the majority of check nodes in FIG. 3 are satisfied, the estimated value of the punctured bit is '0.'

ECC decoding performance can be improved by adding soft information. Soft information indicates, for example, the reliability of estimated bit values. For example, the large difference between the unsatisfied and satisfied check nodes in FIG. 2 indicates that '1' is a very reliable estimated value for the punctured bit in FIG. 2. On the other hand, the small difference between the unsatisfied and satisfied check nodes in FIG. 3 indicates that '0' is not a very reliable estimated value for the punctured bit in FIG. 3.

Figure 4:
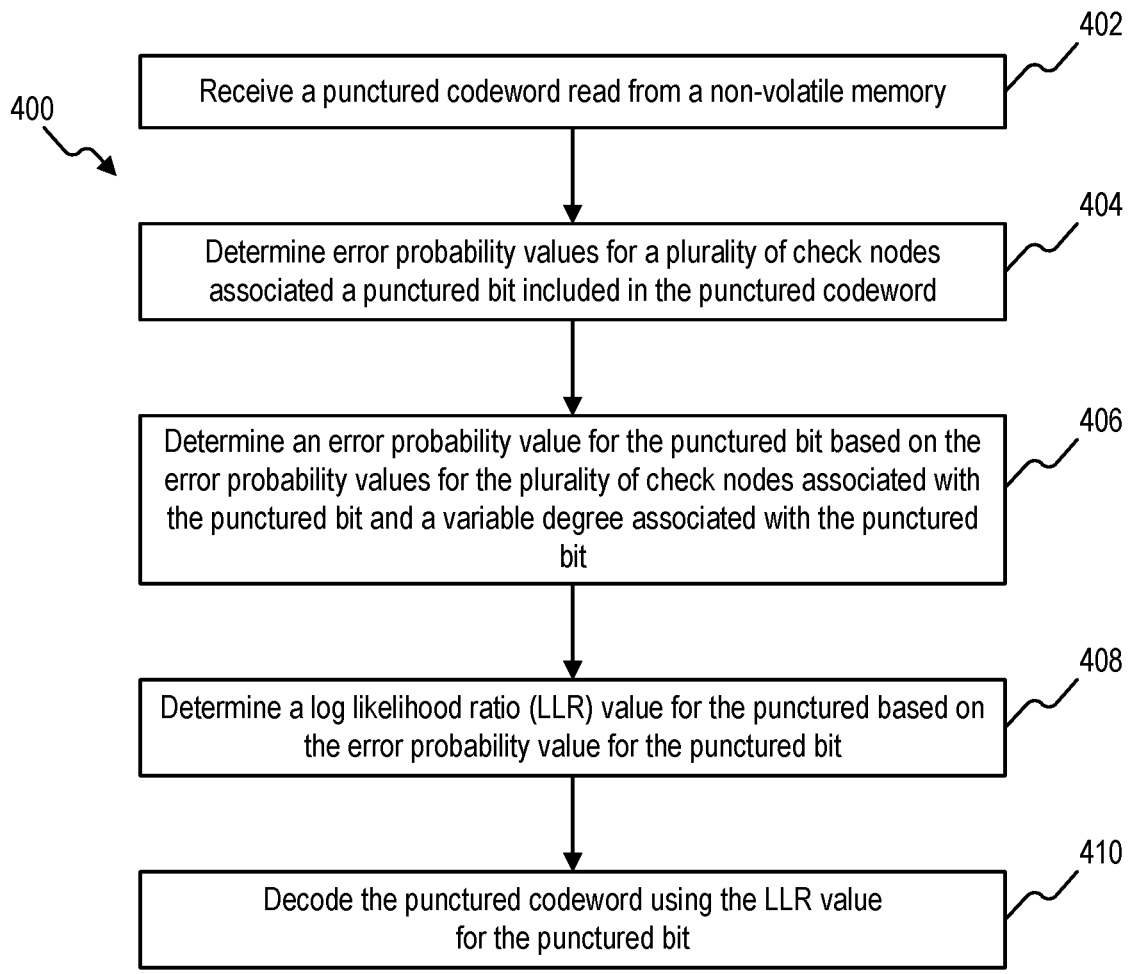
FIG. 4 is a flow diagram of an example of a method for determining soft information for a punctured bit in a punctured codeword, in accordance with some implementations of the present disclosure.

FIG. 4 is a flow diagram of one example of a method 400 for determining soft information for a punctured bit in a punctured codeword. At block 402, a punctured codeword read from the non-volatile memory 104 is received. For example, the control circuit 120 may send a read request to the non-volatile memory 104 and responsively receive the punctured codeword. At block 404, error probability values are determined for a plurality of check nodes associated with the punctured bit. The error probability value for a check node represents the probability that the check node gives a false indication. In some implementations, the control circuit 120 determines an error probability value for a check node associated with the punctured bit based on a channel bit error rate and a check degree associated with the check node. For example, the error probability value for a check node may be determined using Equation (1).

$$q_c = \frac{1 - (1 - 2BER)^{dc-1}}{2} \quad \text{Equation (1)}$$

where:
$q_c$=error probability value for the check node,
BER=channel bit error rate, and
dc=check degree associated with the check node.

The channel bit error rate is, for example, the bit error rate of the channel between the controller 106 and the non-volatile memory 104. In some implementations, the channel bit error rate is either known or can be determined using other known system parameters. The check degree associated with the check node is the number of bits associated with the check node. For example, a check node that is associated with five bits has a variable degree of 5. In some implementations, it is assumed that all of the check degrees associated with the plurality of check nodes have the same value. In other words, it is assumed that all of the check nodes have the same check degree, and thus also have the same error probability value. In other implementations, it is assumed that all of the check nodes have distinct check degrees, and thus also have distinct error probability values.

At block 406, an error probability value is determined for the punctured bit based on the error probability values for the plurality of check nodes associated with the punctured bit and a variable degree associated with the punctured bit. The error probability value for the punctured bit represents the probability that a hard estimation of the value of the punctured bit gives a false indication (i.e., the estimation based on a majority vote). For example, the error probability value for the punctured bit may be determined using Equation (2).

$$P_e = \sum_{i=dv/2}^{dv} \binom{dv}{i} (1 - q_c)^{dv-i} (q_c)^i \quad \text{Equation (2)}$$

where:
$P_e$=error probability value for the hard estimation of the value of the punctured bit,
dv=variable degree associated with the punctured bit, and
$q_c$=error probability value for a check node.

The variable degree associated with the punctured bit is the number of check nodes connected to the punctured bit (or the number of parity check equations the punctured bit participates in). For example, a punctured bit that is associated with six check nodes has a variable degree of 6.

At block 408, an LLR (log likelihood ratio) value for the punctured bit is determined based on the error probability value for the punctured bit. The sign of the LLR value represents the estimated value of the punctured bit. In some implementations, the sign of the LLR value is negative when the punctured bit is '1' and the sign of the LLR value is positive when the punctuated bit is '0.' In other implementations, the sign of the LLR value is positive when the punctured bit is '1' and the sign of the LLR value is negative when the punctured bit '0.' The magnitude of the LLR value represents the reliability of the estimated value of the punctured bit. In some implementations, the control circuit 120 determines the LLR value for the punctured bit logarithmically. For example, the LLR value for the punctured bit may be determined using Equation (3).

$$LLR = \log_2 \frac{1 - P_e}{P_e} \quad \text{Equation (3)}$$

where:
LLR=LLR value for the punctured bit, and
$P_e$=error probability value for the hard estimation of the value of the punctured bit.

In other implementations, the control circuit 120 determines the LLR value for the punctured bit using other methods such as the ones described further below.

At block 410, the punctured codeword is decoded using the LLR value for the punctured bit. In some implementations, the control circuit 120 decodes the punctured codeword internally. For example, the ECC engine 122 may be included in the control circuit 120. In other implementations, the control circuit 120 decodes the punctured codeword by sending the punctured codeword to the ECC engine 122 for decoding by the decoder 128.

In some implementations, the control circuit 120 determines the LLR value for the punctured bit based on a reliability indicator. The reliability indicator indicates whether an estimated value of the punctured bit is reliable or unreliable. In some implementations, the reliability indictor is a binary variable. In some implementations, the control circuit 120 sets the LLR value to '0' when the reliability indicator indicates that the estimated value of the punctured bit is unreliable. Further, the control circuit 120 may set the LLR value to a positive integer or a negative integer when the reliability indicator indicates that the estimated value of the punctured bit is reliable. For example, the control circuit 120 sets the LLR value to '−1' when the estimated value of the punctured bit is a reliable '1,' sets the LLR value to '1' when the estimated value of the punctured bit is a reliable '0,' and sets the LLR value to '0' when the bit is unreliable.

The control circuit 120 determines the reliability indicator based in part on the error probability value for the punctured bit. For example, in some implementations, the control circuit 120 compares the error probability value for the punctured bit to a threshold. The threshold may be determined empirically. When the error probability value for the punctured bit is greater than the threshold, the control circuit 120 sets the reliability indicator to indicate that the estimated value of the punctured bit is reliable. Alternatively, when the error probability value for the punctured bit is less than or equal to the threshold, the control circuit 120 sets the reliability indicator to indicate that the estimated value of the punctured bit is unreliable. The reliability information may be used by an ECC decoder to improve its performance.

Figure 5:
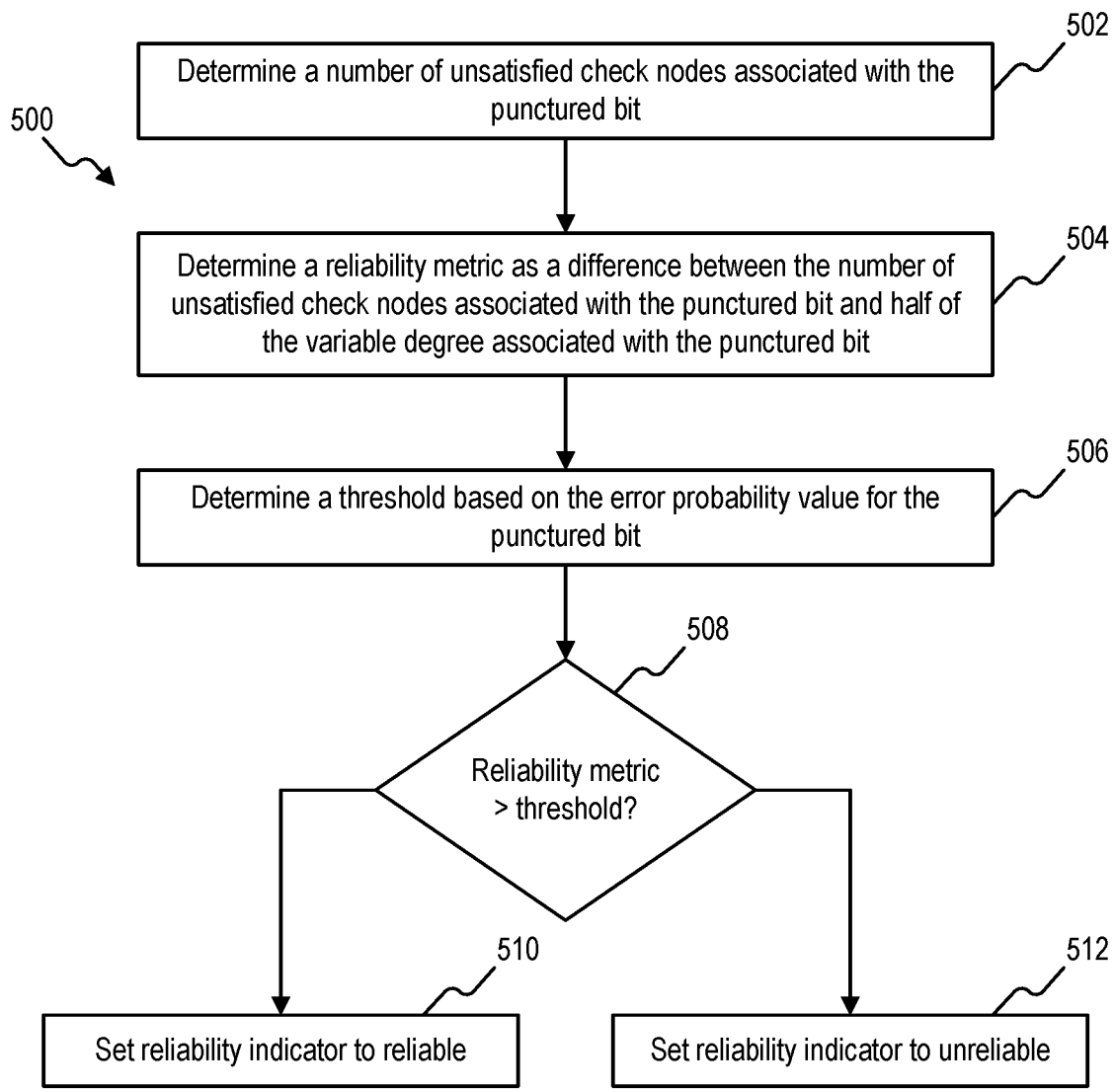
FIG. 5 is a flow diagram of an example of a method for determining a reliability indicator based on the number of unsatisfied check nodes associated with a punctured bit, in accordance with some implementations of the present disclosure.

In some implementations, the reliability indicator is determined based on the number of unsatisfied check nodes associated with the punctured bit. FIG. 5 is a flow diagram of one example of a method 500 for determining a reliability indicator based on the number of unsatisfied check nodes associated with the punctured bit. At block 502, the number of unsatisfied check nodes associated with the punctured bit is determined. For example, the number of unsatisfied check nodes associated with the punctured bit is determined based on a syndrome vector for the punctured codeword.

At block 504, a reliability metric is determined. The reliability metric is the distance between the number of unsatisfied check nodes associated with the punctured bit and half of the variable degree associated with the punctured bit. For example, the reliability metric may be determined using Equation (4).

$$\text{reliability metric} = \left| u_i - \frac{dv}{2} \right| \quad \text{Equation (4)}$$

where:
u_i=number of unsatisfied check nodes associated with the punctured bit, and
dv=variable degree associated with the punctured bit.

The variable degree associated with the punctured bit is the number of check nodes connected to the punctured bit (or the number of parity check equations that punctured bit participates in). For example, a punctured bit that is associated with eight check nodes has a variable degree of 8. The reliability metric is the distance of the number of unsatisfied check nodes from a tie scenario.

The higher the reliability metric, the higher the reliability of the estimated value of the punctured bit. To delineate between reliable and unreliable estimations, a threshold is determined based on the error probability value for the punctured bit at block 506. At block 508, the reliability metric is compared to the threshold. When the reliability metric is greater than the threshold, the reliability indicator is set to indicate that the estimated value of the punctured bit is reliable at block 510. Alternatively, when the reliability metric is less than or equal to the threshold, the reliability indicator is set to indicate that the estimated value of the punctured bit is unreliable at block 512.

Soft estimation of the punctured bit values as disclosed herein improves the correction capability of a decoder and reduces the convergence time, thus reducing latency and increasing the throughput of the decoder. Improved correction capability also avoids the need to retry decoding with higher power decoding gears, or other measures (for example, read voltage calibration, read with soft-bits, and other read failure measures), and thus reduces decoding latency.

In connection with the disclosed implementations, an apparatus includes means for receiving a punctured codeword read from a non-volatile memory. The means for receiving the punctured codeword may correspond, for example, to the memory interface 118, the control circuit 120, the ECC engine 122, or a combination thereof. The apparatus also includes means for determining error probability values for a plurality of check nodes associated with a punctured bit included in the punctured bit. The means for determining the error probability values for the plurality of check nodes may correspond, for example, to the control circuit 120, the ECC engine 122, or a combination of the two. The apparatus also includes means for determining an error probability value for the punctured bit based on the error probability values for the plurality of check nodes associated with the punctured bit and a variable degree associated with the punctured bit. The means for determining the error probability value for the punctured bit may correspond, for example, to the control circuit 120, the ECC engine 122, or a combination of the two. The apparatus also includes means for determining an LLR value for the punctured bit based on the error probability value for the punctured bit. The means for determining the LLR value for the puncture bit may correspond, for example, to the control circuit 120, the ECC engine 122, or a combination of the two. The apparatus also includes means for decoding the punctured codeword using the LLR value for the punctured bit. The means for decoding the punctured codeword may correspond, for example, to the control circuit 120, the ECC engine 122, or a combination of the two.

In some implementations, the means for determining the error probability values for the plurality of check nodes is further configured to determine the error probability values for the plurality of check nodes associated with the punctured bit based on a channel bit error rate and check degrees associated with the plurality of check nodes. In some implementations, all of the check degrees associated with the plurality of check nodes have the same value. In some implementations, the means for determining the LLR value for the punctured bit is further configured to determine a reliability indicator based on the error probability value for the punctured bit and determine the LLR value for the punctured bit based on the reliability indicator. The reliability indicator indicates whether an estimated value of the punctured bit is reliable or unreliable. In some implementations, the means for determining the LLR value for the punctured bit is further configured to compare the error probability value for the punctured bit to a threshold, set the reliability indicator to indicate that the estimated value of the punctured bit is reliable when the error probability value for the punctured bit is greater than the threshold, and set the reliability indicator to indicate that the estimated value of the punctured bit is unreliable when the error probability value for the punctured bit is less than or equal to the threshold. In some implementations, the means for determining the LLR value for the punctured bit is further configured to determine a number of unsatisfied check nodes associated with the punctured bit, determine a reliability metric as a difference between the number of unsatisfied check nodes associated with the punctured bit and half of the variable degree associated with the punctured bit, determine a threshold based on the error probability value for the punctured bit, compare the reliability metric to the threshold, set the reliability indicator to indicate that the estimated value of the punctured bit is reliable when the reliability metric is greater than the threshold, and set the reliability indicator to indicate that the estimated value of the punctured bit is unreliable when the reliability metric is less than or equal to the threshold. In some implementations, the reliability indicator is used as part of the decoding, for example, for calculating the LLR value for the punctured bit as described above.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain implementations and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A memory controller, comprising:
a memory interface configured to receive a punctured codeword read from a non-volatile memory; and
a control circuit coupled to the memory interface and configured to:
determine error probability values for a plurality of check nodes associated with a punctured bit included in the punctured codeword,
determine an error probability value for the punctured bit based on the error probability values for the plurality of check nodes associated with the punctured bit and a variable degree associated with the punctured bit,
determine a log likelihood ratio (LLR) value for the punctured bit based on the error probability value for the punctured bit, and
decode the punctured codeword using the LLR value for the punctured bit.

2. The memory controller of claim 1, wherein the control circuit is further configured to determine the error probability values for the plurality of check nodes based on a channel bit error rate and check degrees associated with the plurality of check nodes.

3. The memory controller of claim 2, wherein all of the check degrees associated with the plurality of check nodes have the same value.

4. The memory controller of claim 1, wherein, to determine the LLR value for the punctured bit based on the error probability value for the punctured bit, the control circuit is further configured to:
determine a reliability indicator based on the error probability value for the punctured bit, wherein the reliability indicator indicates whether an estimated value of the punctured bit is reliable or unreliable, and
determine the LLR value for the punctured bit based on the reliability indicator.

5. The memory controller of claim 4, wherein, to determine the reliability indicator based on the error probability value for the punctured bit, the control circuit is further configured to:
compare the error probability value for the punctured bit to a threshold,
set the reliability indicator to indicate that the estimated value of the punctured bit is reliable when the error probability value for the punctured bit is greater than the threshold, and
set the reliability indicator to indicate that the estimated value of the punctured bit is unreliable when the error probability value for the punctured bit is less than or equal to the threshold.

6. The memory controller of claim 4, wherein, to determine the reliability indicator based on the error probability value for the punctured bit, the control circuit is further configured to:
determine a number of unsatisfied check nodes associated with the punctured bit,
determine a reliability metric as a difference between the number of unsatisfied check nodes associated with the punctured bit and half of the variable degree associated with the punctured bit,
determine a threshold based on the error probability value for the punctured bit,
compare the reliability metric to the threshold,
set the reliability indicator to indicate that the estimated value of the punctured bit is reliable when the reliability metric is greater than the threshold, and
set the reliability indicator to indicate that the estimated value of the punctured bit is unreliable when the reliability metric is less than or equal to the threshold.

7. The memory controller of claim 4, wherein the control circuit is further configured to:

set the LLR value for the punctured bit to 0 when the reliability indicator indicates that the estimated value of the punctured bit is unreliable, and set the LLR value for the punctured bit to either a predetermined positive integer or a predetermined negative integer when the reliability indicator indicates that the estimated value of the punctured bit is reliable.

8. A method performed by a control circuit coupled to a non-volatile memory, comprising:

receiving a punctured codeword read from the non-volatile memory;

determining error probability values for a plurality of check nodes associated with a punctured bit included in the punctured codeword;

determining an error probability value for the punctured bit based on the error probability values for the plurality of check nodes associated with the punctured bit and a variable degree associated with the punctured bit;

determining a log likelihood ratio (LLR) value for the punctured bit based on the error probability value for the punctured bit; and decoding the punctured codeword using the LLR value for the punctured bit.

9. The method of claim 8, wherein determining the error probability values for the plurality of check nodes associated with the punctured bit includes determining the error probability values for the plurality of check nodes associated with the punctured bit based on a channel bit error rate and check degrees associated with the plurality of check nodes.

10. The method of claim 9, wherein all of the check degrees associated with the plurality of check nodes have the same value.

11. The method of claim 8, wherein determining the LLR value for the punctured bit based on the error probability value for the punctured bit further includes:

determining a reliability indicator based on the error probability value for the punctured bit, wherein the reliability indicator indicates whether an estimated value of the punctured bit is reliable or unreliable, and determining the LLR value for the punctured bit based on the reliability indicator.

12. The method of claim 11, wherein determining the reliability indicator based on the error probability value for the punctured bit further includes:

comparing the error probability value for the punctured bit to a threshold, setting the reliability indicator to indicate that the estimated value of the punctured bit is reliable when the error probability value for the punctured bit is greater than the threshold, and setting the reliability indicator to indicate that the estimated value of the punctured bit is unreliable when the error probability value for the punctured bit is less than or equal to the threshold.

13. The method of claim 11, wherein determining the reliability indicator based on the error probability value for the punctured bit further includes:

determining a number of unsatisfied check nodes associated with the punctured bit, determining a reliability metric as a difference between the number of unsatisfied check nodes associated with the punctured bit and half of the variable degree associated with the punctured bit, determining a threshold based on the error probability value for the punctured bit, comparing the reliability metric to the threshold, setting the reliability indicator to indicate that the estimated value of the punctured bit is reliable when the reliability metric is greater than the threshold, and setting the reliability indicator to indicate that the estimated value of the punctured bit is unreliable when the reliability metric is less than or equal to the threshold.

14. The method of claim 11, further comprising:

setting the LLR value for the punctured bit to 0 when the reliability indicator indicates that the estimated value of the punctured bit is unreliable, and setting the LLR value for the punctured bit to either a predetermined positive integer or a predetermined negative integer when the reliability indicator indicates that the estimated value of the punctured bit is reliable.

15. An apparatus, comprising:

means for receiving a punctured codeword read from a non-volatile memory;

means for determining error probability values for a plurality of check nodes associated with a punctured bit included in the punctured codeword;

means for determining an error probability value for the punctured bit based on the error probability values for the plurality of check nodes associated with the punctured bit and a variable degree associated with the punctured bit;

means for determining a log likelihood ratio (LLR) value for the punctured bit based on the error probability value for the punctured bit; and means for decoding the punctured codeword using the LLR value for the punctured bit.

16. The apparatus of claim 15, wherein the means for determining the error probability values for the plurality of check nodes associated with the punctured bit is further configured to determine the error probability values for the plurality of check nodes associated with the punctured bit based on a channel bit error rate and check degrees associated with the plurality of check nodes.

17. The apparatus of claim 16, wherein all of the check degrees associated with the plurality of check nodes have the same value.

18. The apparatus of claim 15, wherein the means for determining the LLR value for the punctured bit based on the error probability value for the punctured bit is further configured to:

determine a reliability indicator based on the error probability value for the punctured bit, wherein the reliability indicator indicates whether an estimated value of the punctured bit is reliable or unreliable, and determine the LLR value for the punctured bit based on the reliability indicator.

19. The apparatus of claim 18, wherein the means for determining the LLR value for the punctured bit based on the error probability value for the punctured bit is further configured to:

compare the error probability value for the punctured bit to a threshold, set the reliability indicator to indicate that the estimated value of the punctured bit is reliable when the error probability value for the punctured bit is greater than the threshold, and set the reliability indicator to indicate that the estimated value of the punctured bit is unreliable when the error probability value for the punctured bit is less than or equal to the threshold.

20. The apparatus of claim 18, wherein the means for determining the LLR value for the punctured bit based on the error probability value for the punctured bit is further configured to:
- determining a number of unsatisfied check nodes associated with the punctured bit,
- determine a reliability metric as a difference between the number of unsatisfied check nodes associated with the punctured bit and half of the variable degree associated with the punctured bit,
- determine a threshold based on the error probability value for the punctured bit,
- compare the reliability metric to the threshold,
- set the reliability indicator to indicate that the estimated value of the punctured bit is reliable when the reliability metric is greater than the threshold, and
- set the reliability indicator to indicate that the estimated value of the punctured bit is unreliable when the reliability metric is less than or equal to the threshold.

* * * * *